United States Patent
Subramanian et al.

(10) Patent No.: US 7,045,466 B2
(45) Date of Patent: May 16, 2006

(54) THREE DIMENSIONAL HIGH ASPECT RATIO MICROMACHINING

(75) Inventors: Kanakasabapathi Subramanian, Albany, NY (US); Xiaojun T. Huang, Ithaca, NY (US); Noel C. MacDonald, Santa Barbara, CA (US)

(73) Assignee: Cornell Research Foundation, Inc., Ithaca, NY (US)

( * ) Notice: Subject to any disclaimer, the term of this patent is extended or adjusted under 35 U.S.C. 154(b) by 0 days.

(21) Appl. No.: 10/607,838

(22) Filed: Jun. 27, 2003

(65) Prior Publication Data

US 2004/0198063 A1   Oct. 7, 2004

Related U.S. Application Data

(60) Provisional application No. 60/392,087, filed on Jun. 27, 2002.

(51) Int. Cl.
*H01L 21/302* (2006.01)

(52) U.S. Cl. ........................ 438/712; 438/770

(58) Field of Classification Search ............... 438/50, 438/52, 337, 410, 412, 425, 459, 696, 712, 438/712.77; 216/2
See application file for complete search history.

(56) References Cited

U.S. PATENT DOCUMENTS

| | | | |
|---|---|---|---|
| 5,021,121 A * | 6/1991 | Groechel et al. ........... 438/712 |
| 5,198,390 A | 3/1993 | MacDonald et al. ........ 437/203 |
| 5,375,033 A * | 12/1994 | MacDonald ............... 361/281 |
| 5,426,070 A * | 6/1995 | Shaw et al. .................. 216/2 |
| 5,536,988 A | 7/1996 | Zhang et al. ............... 310/309 |
| 5,628,917 A | 5/1997 | MacDonald et al. ........... 216/2 |
| 5,770,465 A | 6/1998 | MacDonald et al. .......... 437/67 |
| 6,000,280 A | 12/1999 | Miller et al. ................ 73/105 |
| 6,073,484 A | 6/2000 | Miller et al. ................ 70/105 |
| 6,174,784 B1 * | 1/2001 | Forbes ..................... 438/405 |
| 6,180,536 B1 * | 1/2001 | Chong et al. .............. 438/745 |
| 6,462,391 B1 * | 10/2002 | Chong et al. .............. 257/419 |
| 6,518,192 B1 * | 2/2003 | Khan et al. ................ 438/714 |
| 6,544,863 B1 * | 4/2003 | Chong et al. .............. 438/455 |
| 6,612,029 B1 * | 9/2003 | Behin et al. ................ 29/847 |
| 6,713,367 B1 * | 3/2004 | Solgaard et al. ............ 438/459 |
| 6,730,535 B1 * | 5/2004 | Morimoto et al. ........... 438/50 |
| 6,767,614 B1 * | 7/2004 | Hofmann et al. .......... 428/166 |
| 6,780,337 B1 * | 8/2004 | Goldbach et al. ............. 216/2 |
| 6,797,589 B1 * | 9/2004 | Adams et al. .............. 438/426 |
| 2004/0067346 A1 * | 4/2004 | Hofmann et al. ........ 428/195.1 |

OTHER PUBLICATIONS

Moreau, Wayne, Semiconductor Lithography, Plenum, 1988, pp. 733-734.*

(Continued)

*Primary Examiner*—Asok Kumar Sarkar
(74) *Attorney, Agent, or Firm*—Schwegman, Lundberg, Woessner & Kluth, P.A.

(57) ABSTRACT

Multi-level structures are formed in a semiconductor substrate by first forming a pattern of lines or structures of different widths. Width information on the pattern is decoded by processing steps into level information to form a MEMS structure. The pattern is etched to form structures having a first floor. The structures are oxidized until structures of thinner width are substantially fully oxidized. A portion of the oxide is then etched to expose the first floor. The first floor is then etched to form a second floor. The oxide is then optionally removed, leaving a multi-level structure. In one embodiment, high aspect ratio comb actuators are formed using the multi-level structure process.

27 Claims, 13 Drawing Sheets

OTHER PUBLICATIONS

Albrecht, T. R., et al., "Microfabrication of integrated scanning tunneling microscope", *Journal of Vacuum Science & Technology A (Vacuum, Surfaces, and Films), 8(1)*, (Jan.-Feb. 1990), 317-318.

Hormann, W., et al., "Monolithic three-dimensional single-crystal silicon microelectromechanical systems", *Sensors and Materials, 10(6)*, (1998), 337-350.

Miller, S. A., "Microelectromechanical scanning probe instruments for array architectures", *Review of Scientific Instruments, 68(11)*, (Nov. 1997), 4155-62.

Shaw, K. A., et al., "SCREAM I: a single mask, single-crystal silicon, reactive ion etching process for microelectromechanical structures", *Sensors and Actuators A (Physical), A40 (1)*, (1994), 63-70.

Tirole, N., et al., "3D silicon electrostatic microactuator", *Journal of Micromechanics and Microengineering, 3(3)*, (Sep. 1993), 155-157.

Tirole, N., et al., "Three-dimensional silicon electrostatic linear microactuator", *Sensors and Actuators A (Physical), A48 (2)*, (May 1995), 145-150.

Webb, R. Y., et al., "Suspended thermal oxide trench isolation for SCS MEMS", *Proceedings of the SPIE—The International Society for Optical Engineering, 3519*, (1998), 196-199.

Xu, Y., et al., "Integrated micro-scanning tunneling microscope", *Applied Physics Letters, 67(16)*, (Oct. 1995), 2305-2307.

Zhang, Z. L., et al., "A RIE Process for submicron, silicon electromechanical structures", *Journal of Micromechanics and Microengineering, 2 (1)*, (Mar. 1992), 31-38.

\* cited by examiner

THREE DIMENSIONAL HIGH ASPECT RATIO MICROMACHINING

RELATED APPLICATIONS

This application claims the benefit of U.S. Provisional Application Ser. No. 60/392,087, filed Jun. 27, 2002, which provisional application is incorporated herein by references.

GOVERNMENT FUNDING

The invention described herein was made with U.S. Government support under Grant Number DABT 63-95-C-0121 awarded by DARPA. The United States Government has certain rights in the invention.

FIELD OF THE INVENTION

The present invention relates to micromachining, and in particular to high aspect ratio bulk micromachining.

BACKGROUND OF THE INVENTION

Several process technologies exist for the fabrication of high aspect ratio, single crystal silicon mechanical structures with more than one level. These processes usually involve silicon on insulator wafers, wafer-bonding techniques or require self aligned levels. The techniques require precision in alignment, and do not lend themselves well to reliable, consistent, mass production. They also can involve patterning of photoresist across multiple levels, requiring multiple lithography steps across large features.

SUMMARY OF THE INVENTION

Multi-level structures are formed in a semiconductor substrate by first forming a pattern of lines or structures of different widths. Width information on the pattern is decoded by processing steps into level information to form a MEMS structure.

In one embodiment, the pattern is etched to form structures having a first floor. The structures are oxidized until structures of thinner width are substantially fully oxidized. A portion of the oxide is then etched to expose the first floor. The first floor is then etched to form a second floor. The oxide is then optionally removed, leaving a multi-level structure.

In one embodiment, high aspect ratio comb actuators are formed using the multi-level structure process. The comb actuators are useful in precision positioning of small probes or other devices.

DETAILED DESCRIPTION OF THE INVENTION

In the following description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the scope of the present invention. The following description is, therefore, not to be taken in a limited sense, and the scope of the present invention is defined by the appended claims.

Figure 1A:
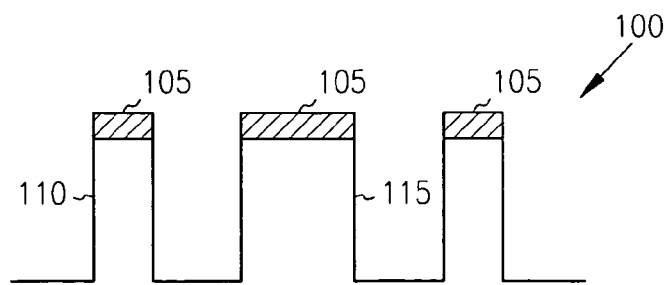
FIGS. 1A, 1B, 1C and 1D are cross sections illustrating the formation of a multi-level structure having two levels.
Figure 1B:
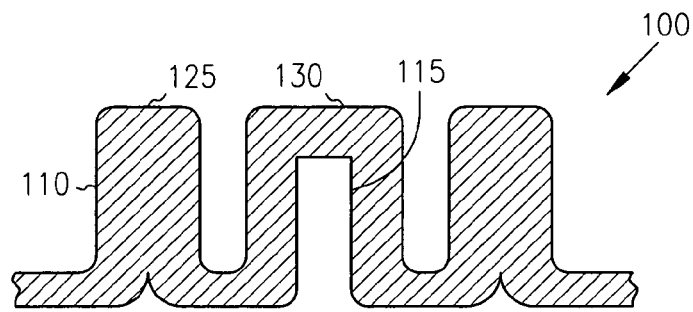

In FIGS. 1A–D, cross sections of two level structures formed in accordance with the present invention are illustrated. The structures are formed on a single crystal silicon wafer indicated generally at 100 (other orientations are also possible) with one lithography step. A first oxide coating 105 is formed on the wafer 100 through thermal oxidation. Other methods of oxidation may also be used. The resulting oxide is approximately 2.27 times the thickness of the silicon that was oxidized. The oxide layer 105 is then pattered with the lithography step to define a mask for formation of lines or structures having two different line widths as indicated at 110 and 115 in FIG. 1A. $CHF_3$ reactive ion etching (RIE) is performed a desired amount of time to form the lines to a desired depth in the silicon wafer or substrate. In one embodiment, a plasma etch is performed using $CHF_3$ flowing at a flow rate of approximately 30 sccm, a pressure of approximately 30 millitorr and power of approximately 90 watts. Oxygen may also be combined to modify the etch rate and to keep the etch clean. This type of etch is fairly well known, and the parameters may be varied significantly to obtain desired results. (Other methods of oxide etching are also possible.) In FIG. 1B, an oxide 125 is then grown over the wafer 100, including the lines 110 and 115. The oxidation time is determined such that the line 10 is substantially fully oxidized, while the thicker lines 115 have a core of silicon covered by an oxide cap as indicated at 130.

Figure 1C:
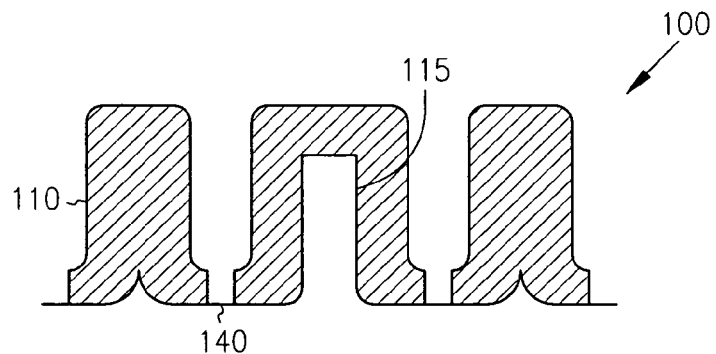
Figure 1D:
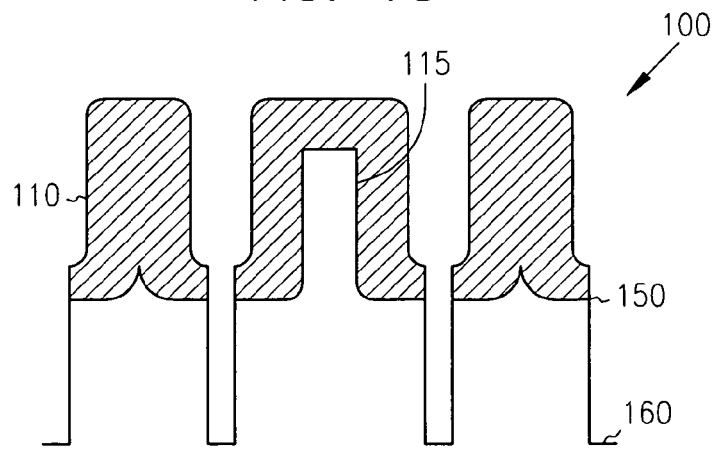

A reactive ion etch using $CHF_3$ is used to anisotropically etch the oxide to expose the silicon floor as indicated at 140 in FIG. 1C. The oxidized thinner lines 110 in combination with the thicker lines 115 effectively form a self-aligned mask for the reactive ion etch. The silicon is then further etched deeper into the silicon wafer by deep RIE as shown in FIG. 1D to form the resulting multi-level structure. The etch may be performed in many different manners, such as by use of a chlorine based RIE etch, fluorine based Bosch process, single crystal reactive etching and metalization (SCREAM) process or others that are known in the art. The SCREAM process is described in U.S. Pat. No. 5,198,390: RIE process for fabricating submicron, silicon electromechanical structures.

The structure consists of a first level 150, and a second, lower level 160. The multi-level structure is released using $SF_6$ RIE. Releasing of the multi-level structure occurs once the etch is extended to the lower level. It is performed by growing or depositing one more layer of oxide (or other passivating material) that covers the sides and floor. The floor is exposed via another etch, and then, the $SF_6$ RIE etches in all directions to create suspended structures. Other release methods may be used, such as KOH etching of silicon. Some part of the structures may still be connected to the wafer to provide a multitude of devices that have different types of motion. After release, the silicon dioxide is optionally left in place or removed in a common manner to expose the silicon structures. If silicon is used as a conducting material in some applications, the oxide need not be removed to create an electrical difference in levels. In fact, in capacitive applications, the presence of the dielectric enhances capacitance when silicon electrodes are used with suitable isolation schemes.

For an out of plane (Z directional) actuator, the height difference between fixed and movable fingers (multi-level fingers) creates a Z directional comb drive in the silicon core. Using a single crystal reactive etching and metalization (SCREAM) process, the floor is cleared, the silicon is etched down and then released with sidewall oxide protection.

Figure 2A:
FIGS. 2A, 2B, 2C, 2D, 2E, 2F, 2G, 2H, and 2I are side cross sections illustrating the formation of a multi-level structure having three levels.
Figure 2B:
Figure 2C:
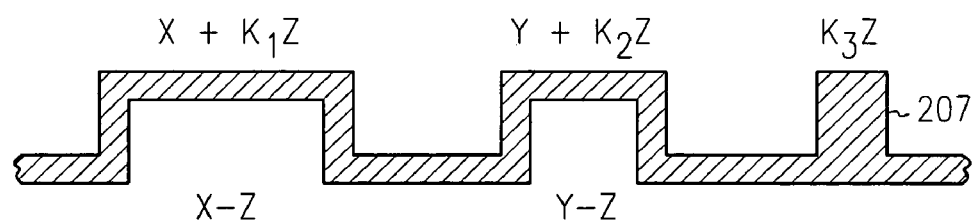
Figure 2D:
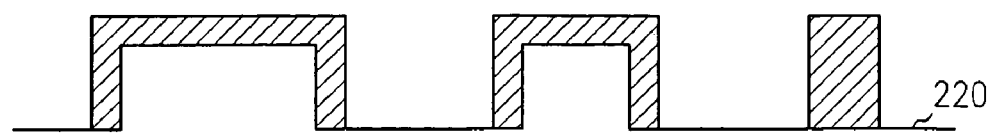
Figure 2E:
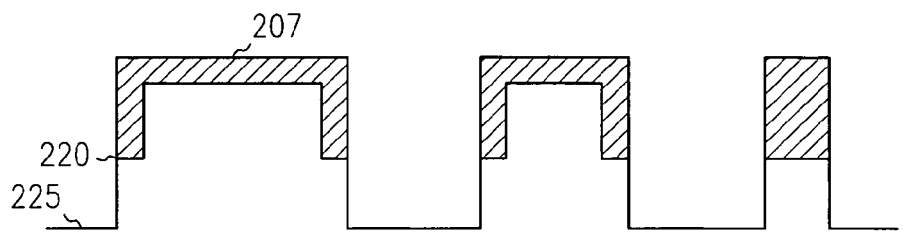

The process is extended to further levels as illustrated FIG. 2A–I. An oxide on a substrate is patterned in FIG. 2A to form a mask for three different line widths as indicated at 205, 206, and 207 having respective widths x, y and z, decreasing in width. The oxide is etched using a reactive ion etch to form beams 215, 216, and 217 in FIG. 2B, having different line widths. An oxidation step performed at FIG. 2C completely oxidizes the thinnest beam 207 having width z. Resulting oxide is approximately 2.27 times the volume of the consumed silicon. It follows that the widths of the silicon beams are now x-z, y-z and zero, and that the total widths including oxide are $x+k_1z$, $y+k_2z$ and $k_3z$ respectively as indicated in FIG. 2C. The oxidation time corresponds to consuming a silicon pillar z microns wide. $k_1$, $k_2$, and $k_3$ are factors that account for the increase in width corresponding to the increase in volume due to oxidation. A floor 220 is then cleared with $CHF_3$ RIE as indicated in FIG. 2D, and the silicon is etched using deep RIE as indicated in FIG. 2E to form a second floor 225.

Figure 2F:
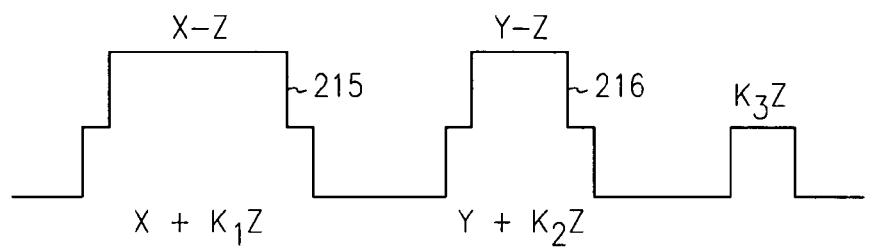

The depth of this second deep silicon RIE step defines the difference between the second and third levels, while the first silicon RIE step defines the spacing between the first and second levels, as in the two level process. The lower portion of the silicon core now has widths of $x+k_1z$, $y+k_2 z$ and $k_3z$. The oxide 207 is now optionally completely stripped from the top of the beams as indicated in FIG. 2F. A second thermal oxidation step 230 is performed, with an oxidation time needed to fully oxidize the top of the middle beam 216, that is y-z wide. The following considerations are used to arrive at a relationship between x, y and z as constraints in the initial mask design for lithography:

When the top portion of the center beam, or the middle thickness beam is fully oxidized, the thinnest beam should also be fully oxidized. For a rough estimate, it is assumed that the increase in volume is primarily due to increase in width, then $k_3$=2.27. Mathematically, this results in y-z>2.27z, or y>3.27z. The widest beam should not be fully oxidized during the second thermal oxidation step. This means that x-z>y-z, or x>y and x>3.27z, which should follow automatically from an initial assumption that x>y>z.

Figure 2G:
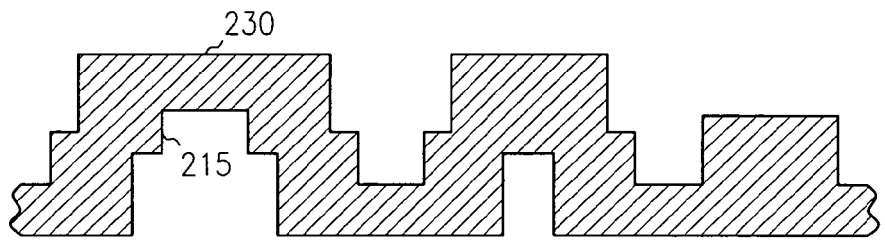
Figure 2H:
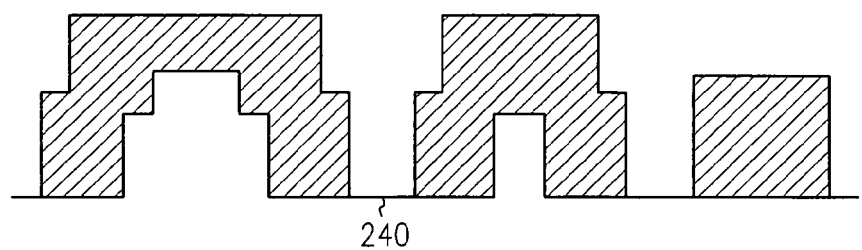
Figure 2I:
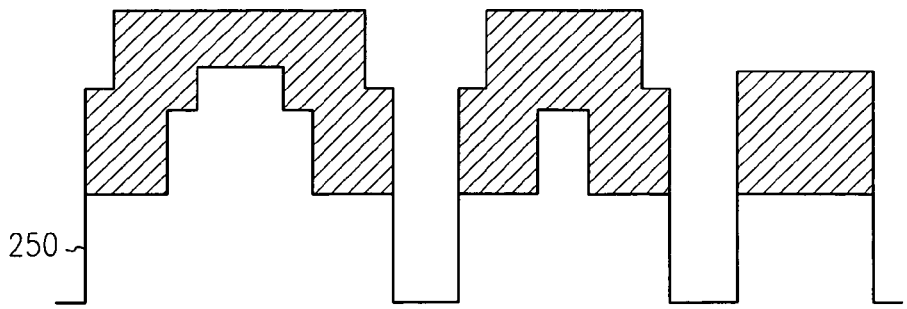

FIG. 2G illustrates the three beams after the second oxidation step. The oxide on a deeper floor 240 is then etched with $CHF_3$ RIE in FIG. 2H. The third deep RIE step as shown in FIG. 2I determines the height of the lowest level 250, and the structure is finally released after sidewall oxide protection. As long as the above relations are satisfied, patterns that lie on the three different levels can be made as shown in FIG. 2I. The same process can be extended to even further levels with the oxidation and etching steps repeated in sequence. There are further constraints on beam widths that play a role in the design space for such further multi-level structures.

Figure 3:
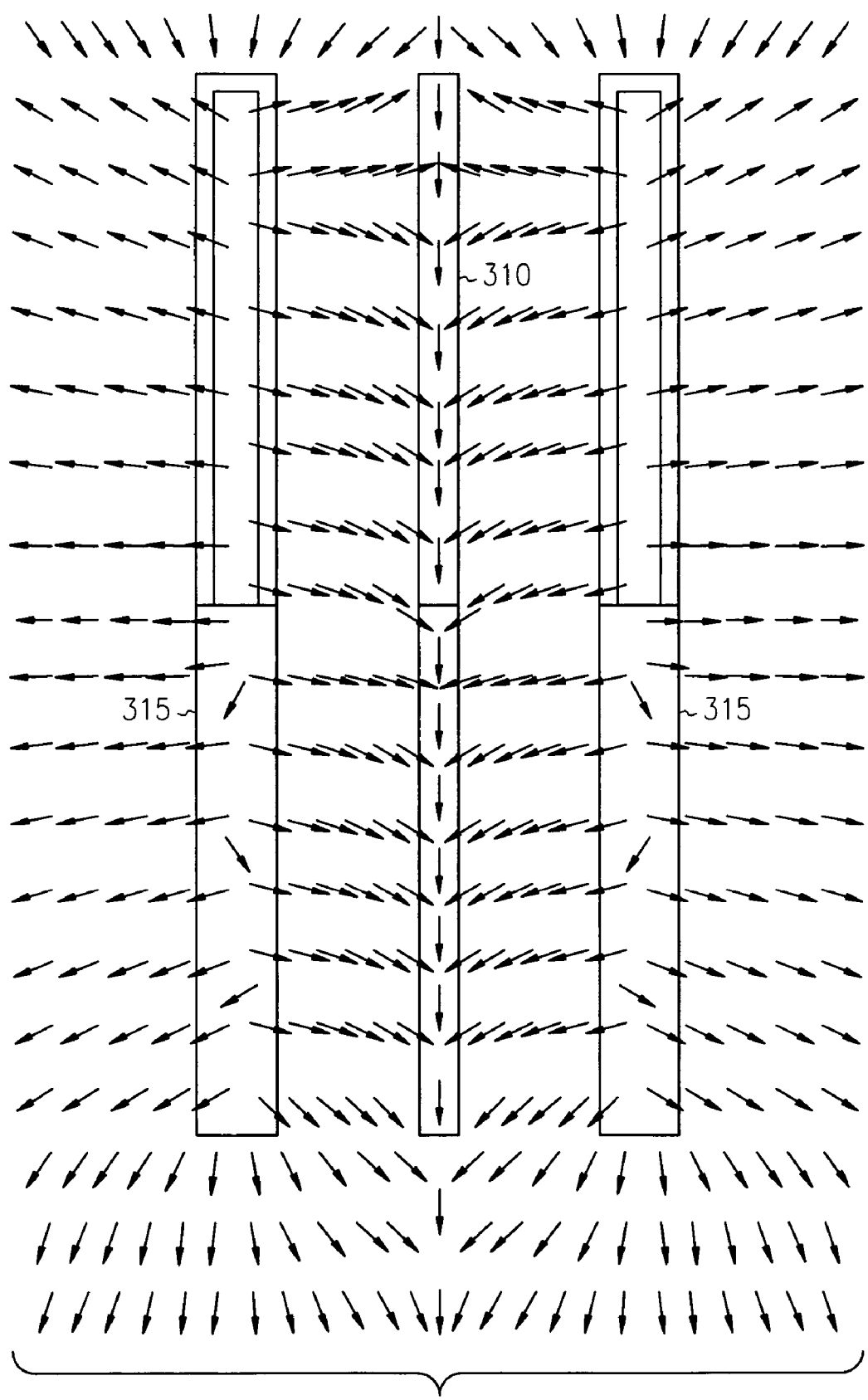
FIG. 3 is a cross section showing actuator field lines for a comb formed in accordance with the present invention.

An actuator comb is shown with actuator field lines in FIG. 3. A center comb-finger 310 is thinner than adjacent comb fingers 315, and has a silicon portion at a lower level. The top of center comb 310 is fully covered with $SiO_2$ in this embodiment. The combs are formed as described with respect to FIG. 1. The adjacent, or side fingers 315 have a top half having a core of silicon covered with $SiO_2$, while a bottom half of the side fingers 315 is only silicon. A Coulomb boundary element simulation results in electric field lines indicated with the arrows, where wider fingers are positively biased and center finger and base plane are grounded).

Figure 4:
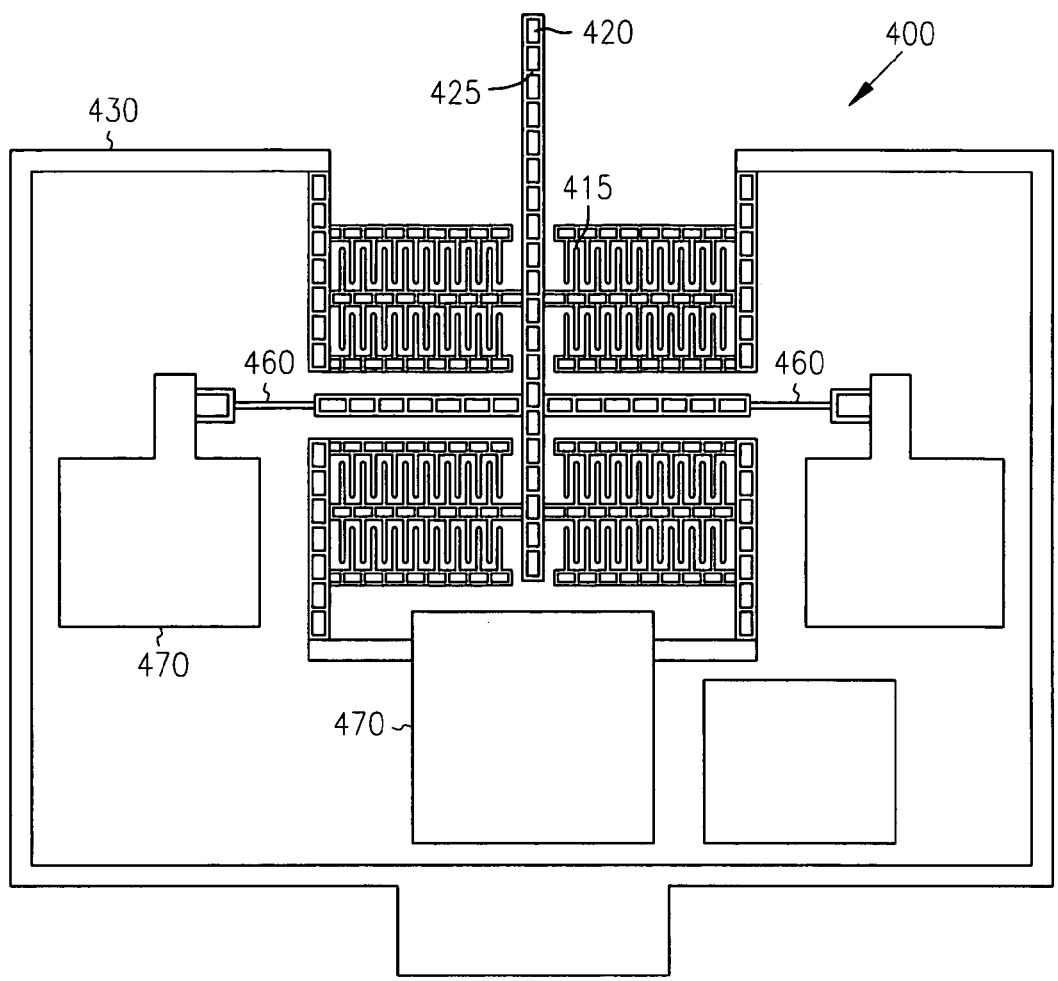
FIG. 4 is a plan view of a z-actuator on a torsional spring formed in accordance with the present invention.
Figure 5:
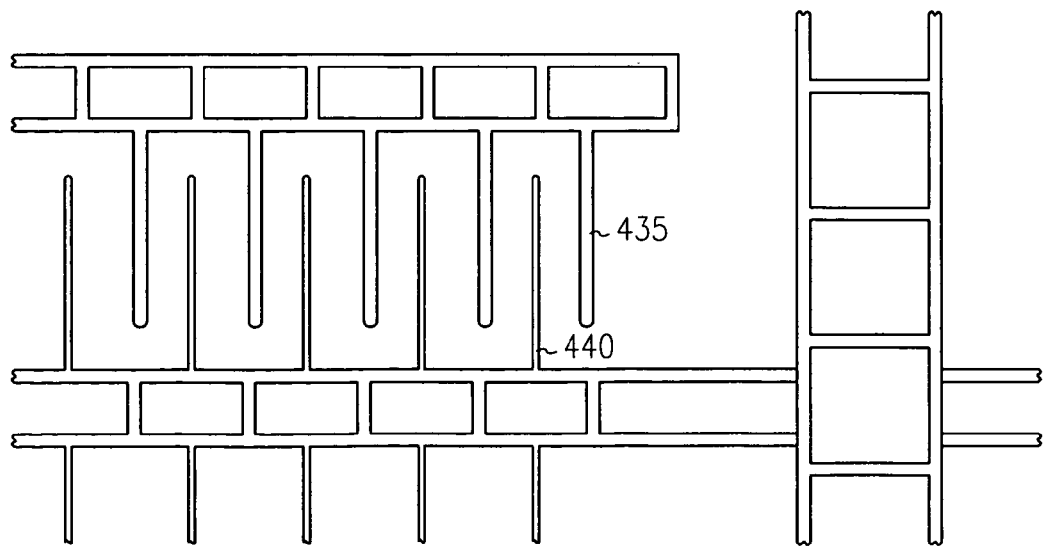
FIG. 5 is a magnified view of fingers of the z-actuator of FIG. 4.

FIG. 4 is a plan view of a z-axis torsional actuator formed using the above process. FIG. 4 shows the overall actuator at 400 formed on a substrate. The actuator 400 has a plurality of fingers 415, shown in further detail in a magnified view of the actuator at 435 and 440 in FIG. 5, corresponding to thick and thin fingers respectively. Thick fingers 435 are coupled to a support structure 430 to provide a stable support for the actuator with respect to the substrate. Thin fingers 440 are coupled to an actuator beam 425, such that proper energization of the fingers causes motion of an end 420 of the actuator beam in and out of the page through a suspended torsional spring 460. The larger squares, 470, are bonding pads. Applying voltages to them causes the motion of end 420.

The arrangement of the fingers may be varied as desired, such as by reversing the thin and thick fingers with respect to the actuator beam and support structure. Further actuators for providing motion in different directions may be easily constructed using the process.

Figure 6:
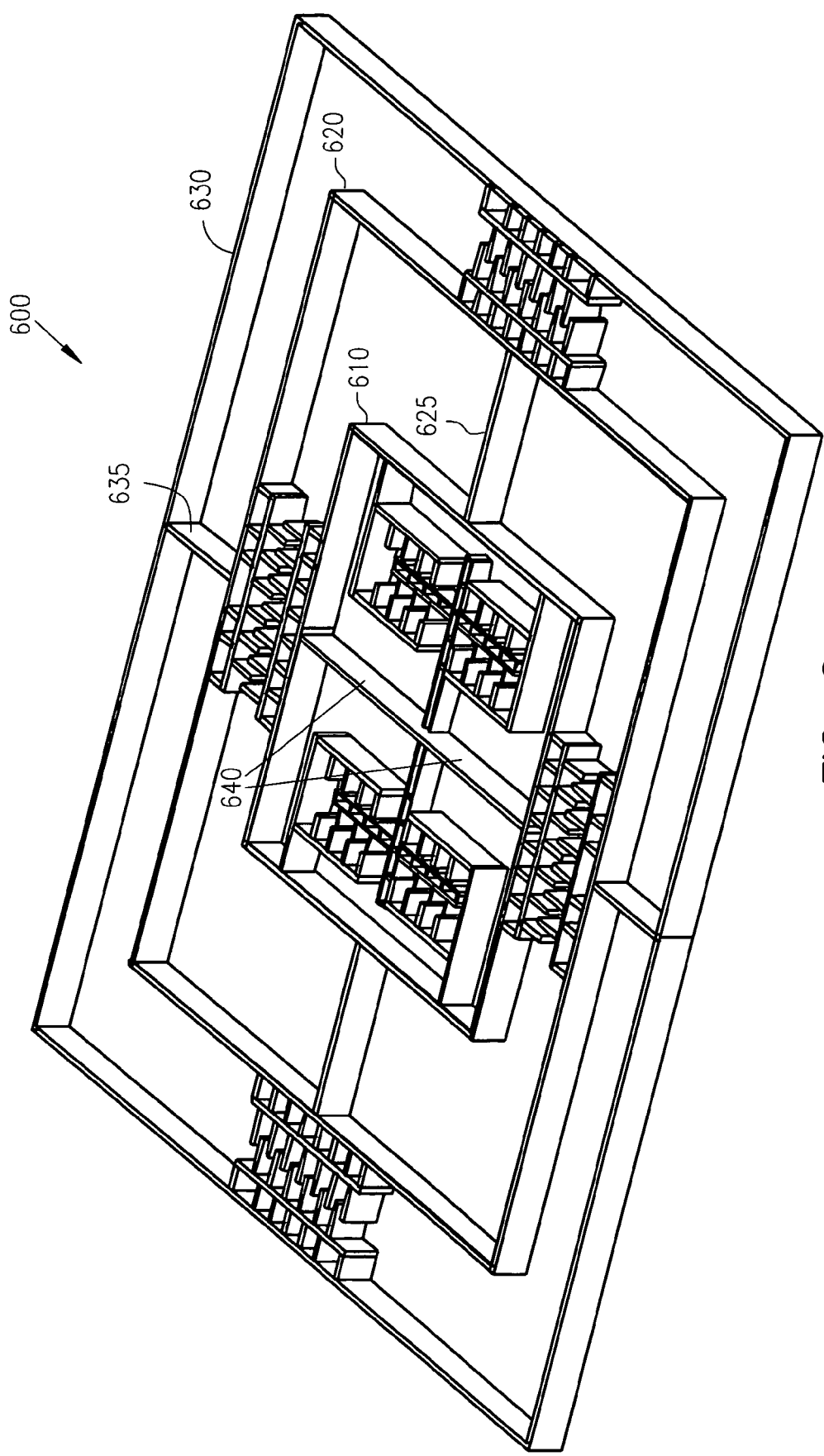
FIG. 6 is a perspective view of a nested multiple stage actuator formed in accordance with the present invention.

FIG. 6 shows a three dimensional actuator at 600 have three nested X, Y, Z stages. The Z stage comprises a frame 610, and moves in and out of the page in a z-direction when actuated via contacts not shown. The Z stage has opposing sets of mating fingers formed on different levels and coupled to each other by an axis to provide the z-direction motion when properly actuated. One set of fingers is fixed, and the other set is moveable. The moveable set is coupled to the axis. The axis is coupled to a torsional spring 640, allowing such motion when force is applied. Frame 610 surrounds the Z stage, and serves to support both the spring, and fixed fingers. The formation of such fingers is described with reference to FIGS. 9 and 10 or FIGS. 1A–1D (either method can be used to make the Z stage).

Y stage indicated at frame 620 has two opposing sets of mating fingers formed on the same level, which move into and away from each other depending on actuation. The movable fingers of these sets are coupled to frame 610, and server to move the entire frame 610 in a Y direction. The frame 620 is coupled to frame 610 by a spring 625. X stage indicated at frame 630 has opposing sets of mating fingers formed on the same level, which again move into and away from each other in a direction transverse to the direction of the Y stage. Frame 630 is coupled to frame 620 by a spring 635. Moveable fingers of the X stage are coupled to frame 620, to provide X direction movement of frame 620. The mating fingers are formed in accordance with the process described above in one embodiment. The mating fingers may also be formed in three levels as described below.

In one embodiment, Z stage suspended fingers and supporting structures are thinner, and hence will be lower level in the two level process. All the other fixed and suspended fingers, frames and springs are of wider width. Known isolation techniques are utilized to achieve the stage within a stage within a stage design.

Figure 7:
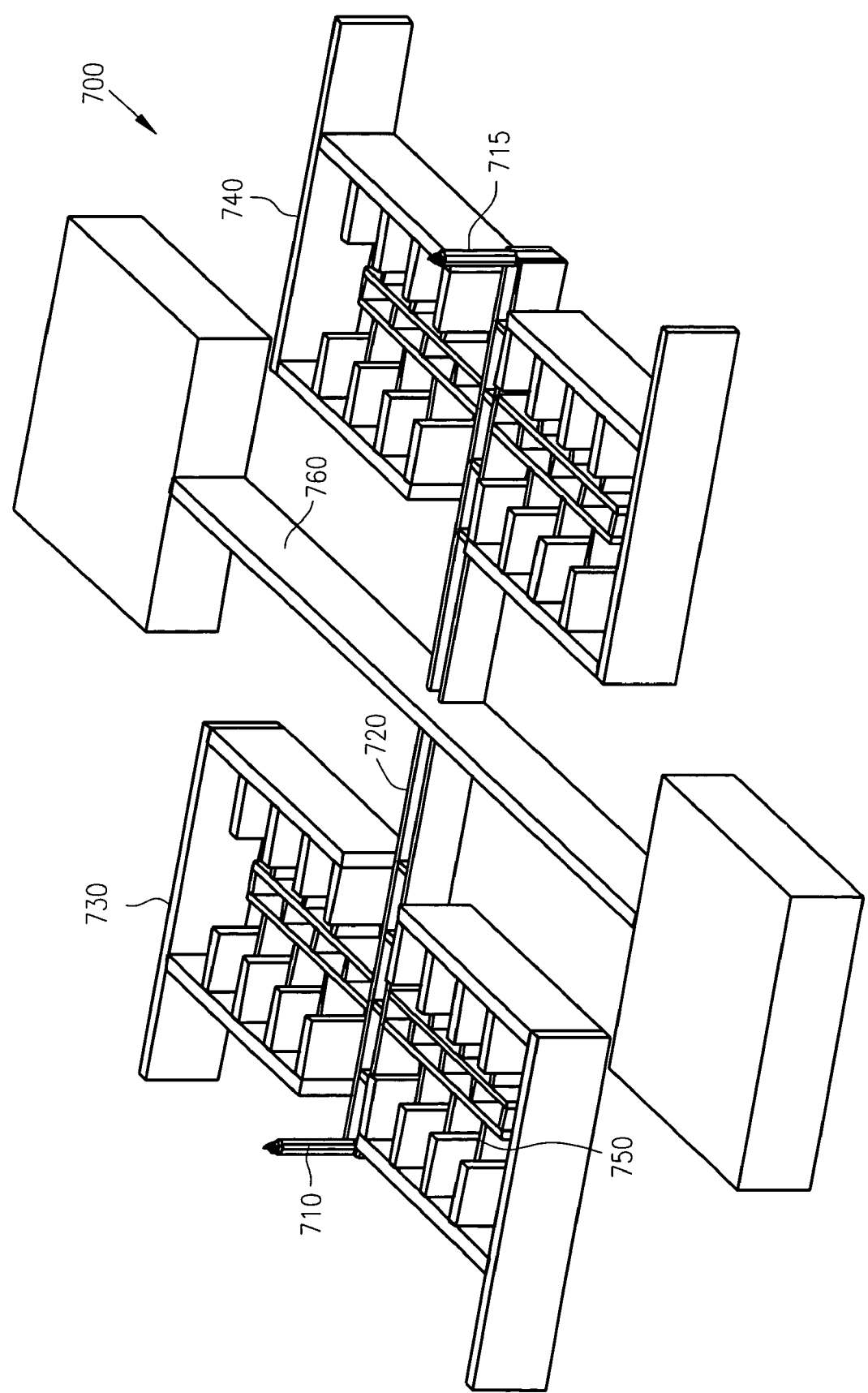
FIG. 7 is a perspective view of a z-actuator on a torsional spring having probes.

A Z actuator indicated generally at 700 in FIG. 7 has a pair of single crystal silicon tips 710 and 715 mounted on an axis 720. Actuator banks 730 and 740 on either side of the torsion spring 720 are fixed portions of the Z actuator. Movable comb fingers 750 in the actuator banks are interlaced with thicker fingers in the actuator banks. They are supported by a torsional spring 760. Both the comb fingers 750 and supporting structures are thinner than the thicker fingers in the actuator banks, and are thus on a lower level when formed using the two level process described herein. The thinner fingers optionally have a top level of oxide. The oxide is not shown in the figures for the sake of clarity, so that the two level Z actuator is clearly seen.

Figure 8:
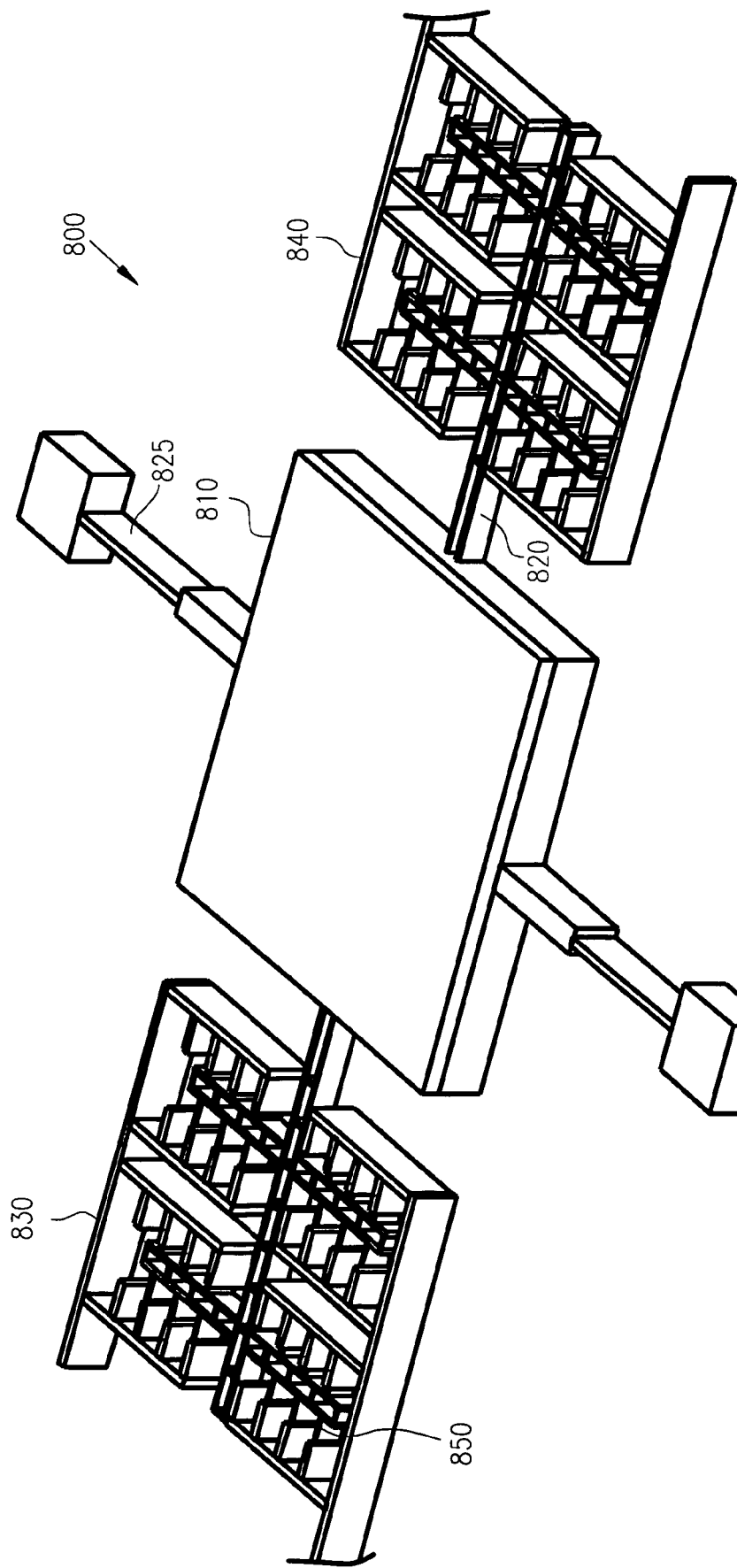
FIG. 8 is a perspective view of a z-actuator on a torsional spring with a mirror.

A Z actuator indicated generally at 800 in FIG. 8 has a mirror 810 mounted on an axis 820. Mirror 810 is also coupled to a torsional spring 825 orthogonal to the axis 820, allowing movement of the mirror about the torsional spring 825. Part of the torsion spring is thicker so that the frequency of an in-plane twisting mode is much higher than the torsion mode. Actuator banks 830 and 840 are disposed on either side of the torsion spring 820 along the axis 820, and are the fixed portions of the Z drive. Movable comb fingers 850 are supported by the axis 820 and interleaved between thicker fingers in the actuator banks. The comb fingers 850, and supporting structures are thinner, thus are on a lower level when formed using the two level process described herein. Fixed fingers and corresponding supporting structures are thicker in width. In one embodiment, the mirror is either filled in with oxide and polished or bonded to a flat mirror at a later stage.

The Z actuator 800 is formed in a three mask process. A first mask forms the actuator banks and supporting structures. A second mask forms spring and supporting structure underneath the mirror. A third mask on a second wafer is used to form the mirror, which is then bonded to the supporting structure. In a further embodiment, a larger displacement is provided by the Z actuator by providing a larger height difference between fixed and moveable fingers on comb banks.

Figure 9:
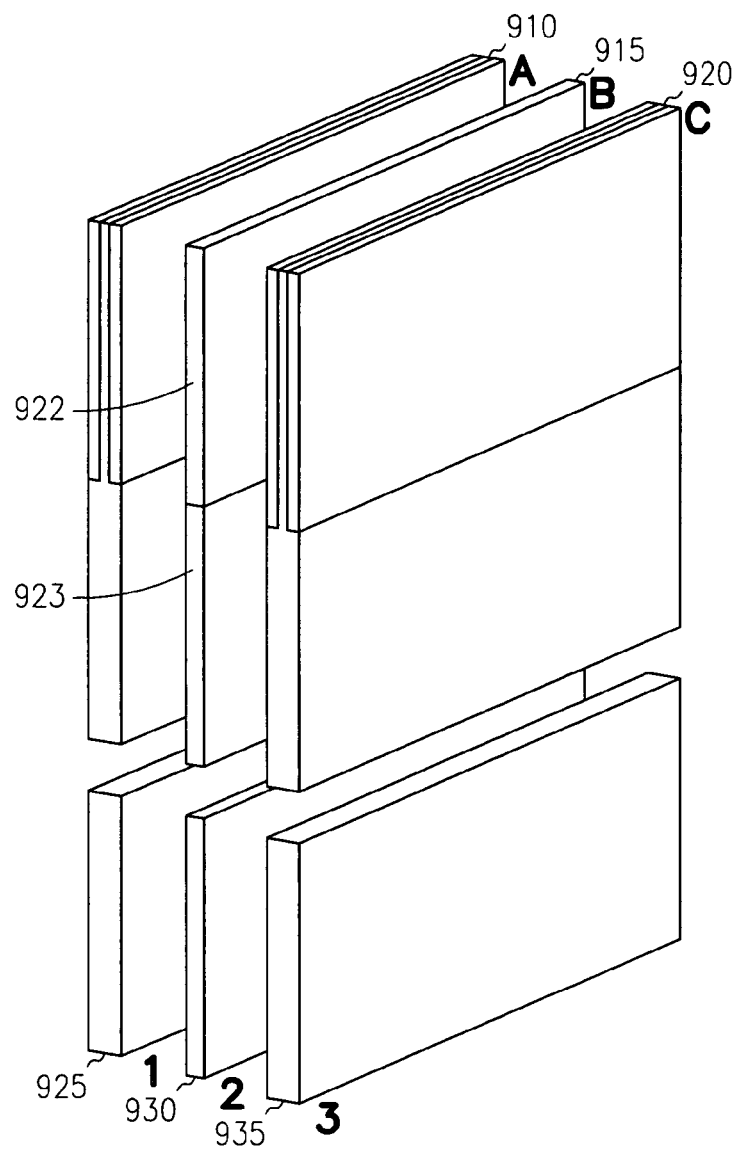
FIG. 9 is a block representation of a portion of a z-actuator formed using shadow masking.

FIG. 9 is a representation of the formation of fingers for the comb banks. Three comb fingers 910, 915 and 920 labeled A, B and C are formed using the two level process. Finger B is of smaller width, having a top fully oxide portion 922, and a bottom portion 923 fully silicon. Fingers A and C have top portions having oxide walls and a silicon core. The fingers are then released such that only B is fully released, but A and C are partially undercut. A and C are shown released for convenience. In reality, the partial undercut is fully oxidized. The fingers are again etched at this point by deep Si RIE, so that shadows 925, 930 and 935 (labeled 1, 2 and 3) of the fingers are formed. Fingers A and C are electrically isolated from their shadows 1 and 3 by the oxidation of them. Finger B and shadow 2 are mechanically coupled. In another embodiment, A & C are partially undercut and C is released just after the first level is formed. The undercut is fully oxidized. The shadow etch creates 1, 2 and 3. In this embodiment, 1, 2, 3 form the second level, while A, B & C form the first level (In the other method, A, B & C are two level structures and 1, 2, 3 form a third level. The two level process flow for A,B,C is not taken to completion in this variation to the process described here) To operate as a Z actuator, 1, 2, 3 and B are grounded, and A and C are positively biased.

Figure 10:
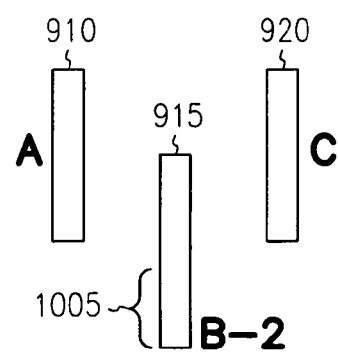
FIG. 10 is an electrical representation of the z-actuator of FIG. 9.

FIG. 10 illustrates an effective electrical picture of the Z actuator formed in FIG. 9. The fixed fingers, A and C, are positively biased, while their shadows 1 and 3 are grounded. Thus, 1 and 3 are approximately removed from the electrical picture. This biasing scheme is possible because A is electrically isolated from 1 through an oxide segment, as is C from 3.

The lower level of B and its shadow 2 are grounded. Even through B and 2 are released, they are mechanically connected on support structures far away from the fingers. In this embodiment, B-2 does not overlap A and C entirely. Rather, there is a portion of B-2 extending out from A and C as indicated at 1005. This feature provides two potential advantages. The force is constant over the entire range of motion of B-2. The range of motion of the Z drive is approximately equal to the entire difference in height produced by the two level process. If B completely overlaps A and C, the range of motion is approximately half the difference in height, and the force drops down to zero linearly.

Figure 11:
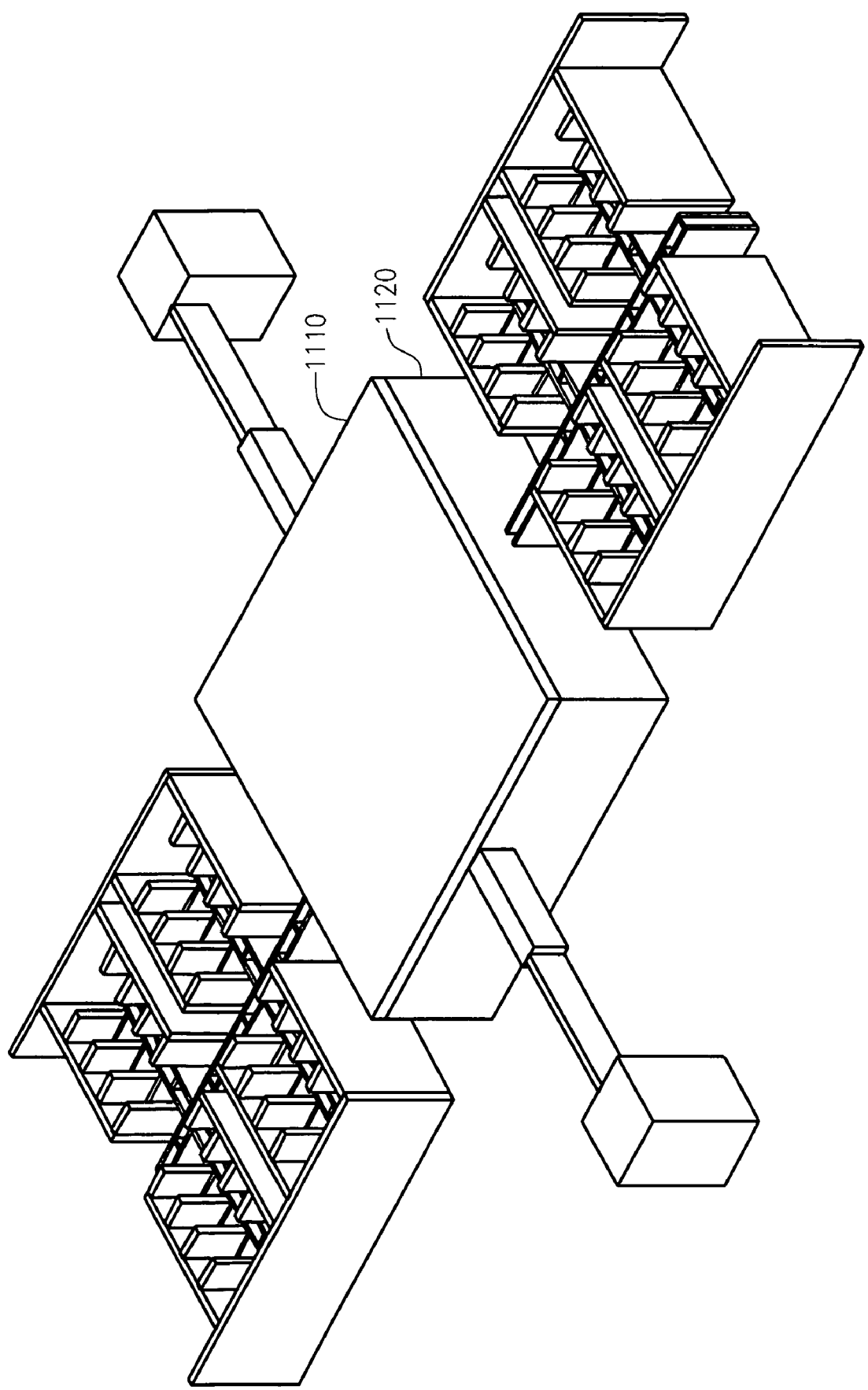
FIG. 11 is a perspective view of an alternative z-actuator on a torsional spring with a mirror.
Figure 12:
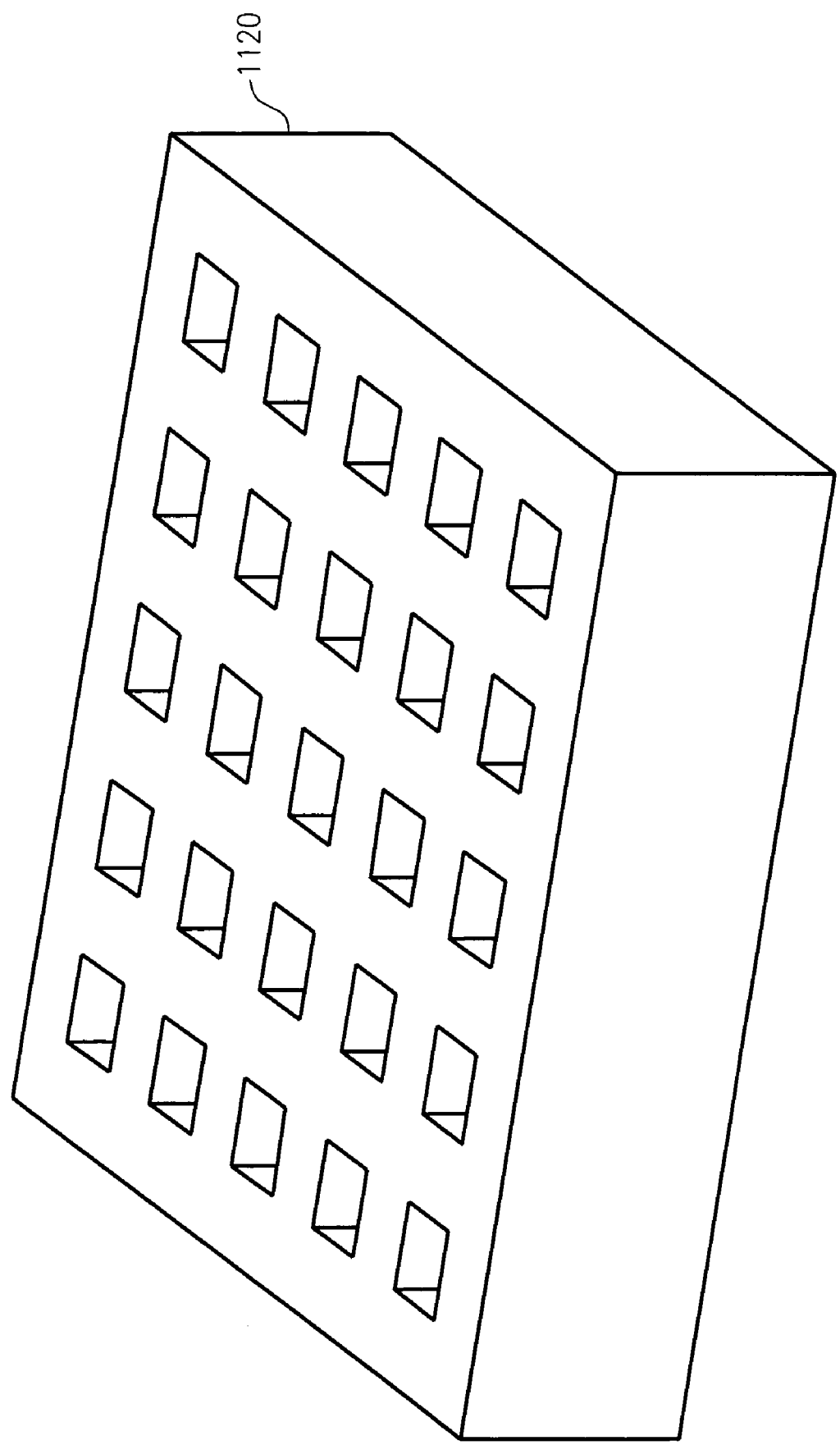
FIG. 12 is a perspective view of a honeycomb support structure for the mirror of FIG. 11.

FIG. 11 shows a Z actuator with a mirror 1110 formed in a manner similar to that of FIG. 8. A larger difference in height between moveable and fixed fingers provides a larger displacement as described above. The mirror 1110 is formed with a support structure 1120 between the mirror 1110 and substrate. Support structure 1120 is shown in further detail in FIG. 12. The support structure comprises a honeycomb structure having line widths wider than both the thick and thin fingers to provide an electrical path from the bottom level of the thin fingers to a top level grounded bonding pad.

Figure 13:
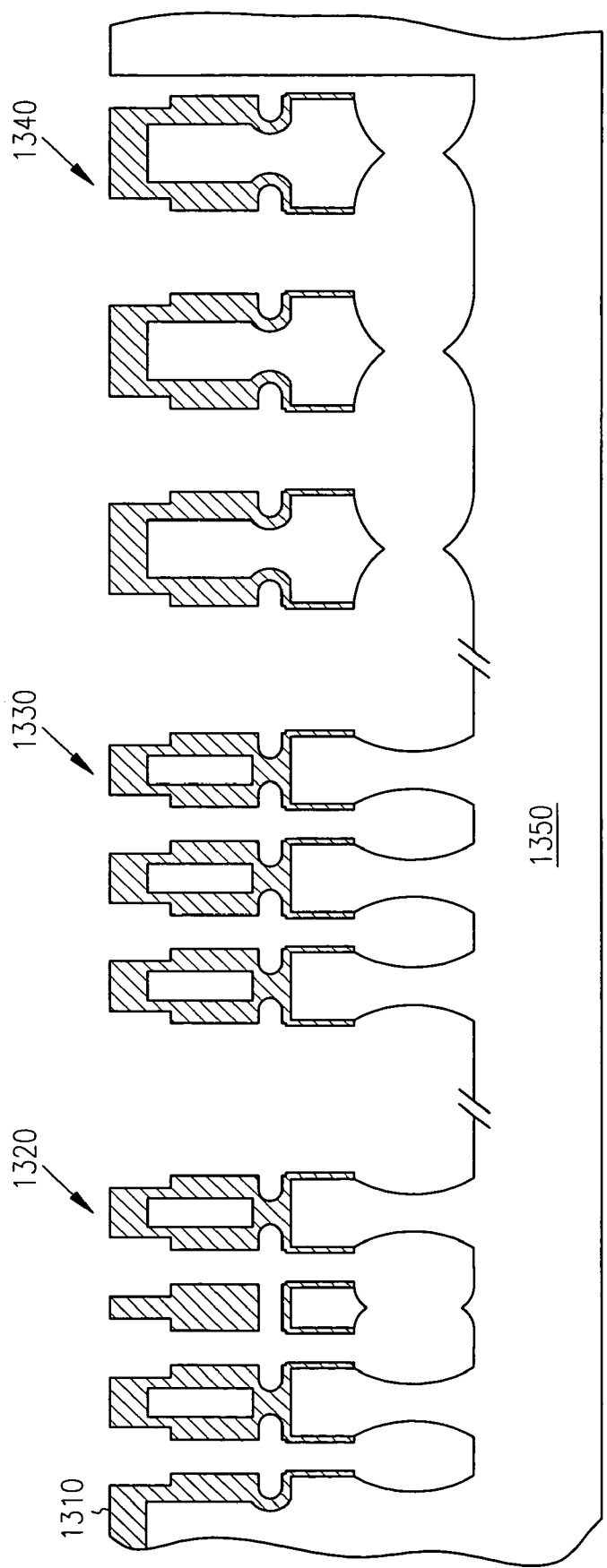
FIG. 13 is a cross section representation of the z-actuator of FIG. 11 illustrating electrical biasing schemes.

A structure cross section for biasing the Z actuator with mirror of FIG. 11 is shown in FIG. 13. A large bonding pad is shown at 1310. Fingers of the actuator are indicated generally at 1320 and comprise both thick and thin or fixed and moveable fingers. A honeycomb bonding pad is shown generally at 1330, and a mirror support structure formed using a separate mask is indicated generally at 1340. The large bonding pad is electrically connected to different levels, and is fixed to a substrate 1350, which is grounded. Thick comb fingers have electrically isolated level, and are fixed to the substrate. Bottom levels of the thin comb fingers are released, and biased using the large bonding pad through the mirror structure. The mirror support structure 1340 is also released.

Isolation schemes for the Z actuators include the following:
1. The top and bottom levels of the thick fingers are isolated by a section of thermal oxide. The thin fingers are released, while the thick fingers are partially undercut. The "neck" at the undercut is fully oxidized.
2. The substrate is grounded
3. One kind of bonding pad on the wafer are structures of large width where the "neck" formed by partial undercut does not fully oxidize. This bonding pad contacts the substrate at both levels and is hence grounded.
4. The other kind of bonding pad is a structure formed by a "honeycomb" of intersecting lines of width equal to the width of the thicker fingers. This kind of bonding pad is a two level bonding pad with electrical isolation between each level.

5. The thick fingers are connected to the "honeycomb" bonding pad. This means that the top level of the thick fingers is connected to the top level of the bonding pad and bottom level of the thick fingers is connected to the bottom level of the bonding pad. The two levels are, of course, electrically isolated from each other.
6. The top level of the thick fingers is hence biased by biasing the top level of the bonding pad
7. During the final release, the bottom level of the thin finger is released while the bottom level of the thick finger is not fully released intentionally. The bottom level of the thick finger is hence in contact with the substrate and is hence grounded.

The thin fingers are suspended through the mirror/spring. The spring is connected to ground because the spring ends in large bonding pads. The thin fingers are connected to the mirror support structure which is a honey comb (for release purposes) but the lines on the honeycomb are very wide and hence their "necks" will not be fully oxidized. This honeycomb contacts the bottom level of thin fingers (top level of thin fingers is fully oxide) and also contacts the top level of the spring. The top and bottom levels are connected within the support structure because of its large line widths as shown.

An alternative method of forming a micromirror on a z actuator involves different process variations. The process is an extension to the basic two level process and includes a combination of thermal oxidation based line width differentiation with shadow masking and vertical isolation using narrow necks.

In one embodiment, highly doped p+ wafers are used because structural silicon is used as the conducting material. Standard 4"<100> wafers are used. <100> wafers are used so that KOH etch steps can, if necessary, be used to create large sidewall faceting at a later stage. KOH etching stops at the <111> plane and creates sidewalls that are far more faceted than what is possible by profile control in the Bosch etcher. 4" wafers are chosen for compatibility with the clean room tools. Additionally, for the die size used in the mask layout, about 5 die can fit on a 4" wafer. A 5×5 array of chips is useful for calibration during various stages of the process. A box of 25 wafers is taken through the process flow. Both individual devices and whole wafers may be sacrificed for calibration along the process.

A 3 µm of thermal mask oxide is grown on the wafers. Wet oxidation at 1100° C. is done for all thermal oxidation steps in the process. Silicon dioxide flows at that temperature and residual stresses in the device are lower. Thermal oxidation steps are very predictable and no characterization is required at this stage. One generation of devices has 0.5 µm movable fingers. The small width on the movable fingers reduces thermal oxidation time and consequently reduces the stress issues associated with thermal oxidation. Small finger width also reduces the first level release time and hence the vertical gap. However, it is difficult to maintain the integrity of 0.5 µm features over large depths.

Lithography may be tuned for a 0.5 µm minimum feature size and 2.5 µm minimum gap. Overexposure may help reduce line width at the cost of increasing the gap, thus providing an additional dimension of control in the lithography. SPR 955 photoresist gives fine lines and spins to about 1 µm thickness at 3000 rpm. The following recipe is used for resist coating:

1. Solvent clean: Acetone, Iso Propyl Alcohol (IPA)
2. Dehydration bake: 100° C., 3 minutes. Cool 3 minutes
3. HMDS Primer: Coat and wait for 15 seconds, Spin 3000 rpm, 30 seconds
4. SPR 955 photoresist: 3000 rpm, 30 seconds
5. Pre-Bake: Hot Plate, 100° C., 90 seconds. Cool 1 minute
6. Optional CEM 365 (Contrast Enhancement Material): 3500 rpm, 30 seconds
7. Expose on 5× Stepper with 5× Chrome mask (typically 1.1 seconds)
8. Post Exposure Bake: 110° C., 90 seconds
9. If CEM is used, wash CEM away with DI water
10. Develop: MF 701, 75 seconds with occasional mild agitation
11. DI rinse for 2 minutes, purge DI, rinse again for 2 minutes
12. Soft $N_2$ blow dry The photoresist spin step is not very tolerant to contaminants in the resist. Such contaminants leave streaks and patches on the wafer after spinning. This problem is solved to a large extent by ramping up the spin speed during the first 10 seconds and spinning at 3000 rpm for the rest 20 seconds. That way the heavier particles are pushed out of the wafer before the resist dries. Repeatable 0.5 µm lithography with 0.5 µm and 1 µm lines and 4 µm spaces may be obtained.

Baking parameters, especially temperature, can be used to modify the sidewall profile of the photoresist. The profile should be as vertical as possible so that a faithful pattern transfer to oxide is also vertical. The lithography parameters presented are optimal for SPR 955 and may vary for other equipment.

Developing parameters do not seem to have a significant effect on the pattern. The DI rinse after the develop step is very important in that it should be long enough to clean the wafer of residual photoresist very well.

A focus/exposure test may be used to find the optimum focus and exposure settings for the stepper under current conditions. A device array is exposed for the purpose, wherein the exposure is swept on the horizontal axis and focus is swept on the vertical axis. Exposure is tuned predominantly for feature and gap size while the focus is tuned for sidewall resist profile. A typical exposure time for SPR 955 is 1.1 seconds. This number could change from run to run.

While exposing the wafer in the stepper, it is important to align the mask using the fiducials and also to align the wafer to the screws on the chuck. This is all the more important for the front side/back side process where the stencil wafer that is used for the back side etch will also be aligned to the same screws on the chuck before it is exposed with the stencil mask and will eventually be aligned to the back side of the device wafer. Other methods of alignment may also be used.

When exposing a large batch of wafers recalibration of the exposure and focus settings every few wafers may be desired because of the intensity drift in the lamp.

The oxide etch process is calibrated to maintain straight sidewalls on 0.5 µm features while preserving the integrity of the 3 µm mask oxide. This mean that high selectivity, fine features, high aspect ratios and straight etch profiles are important requirements at this step. Thin photoresist is used to pattern the fine features. A standard oxide etch that uses $CHF_3$ and $O_2$ is made very selective to photoresist by reducing the $O_2$ flow to near zero. The 3 µm thermal oxide mask is preserved during the etch but the sidewall is very tapered.

$CF_4$ chemistry is used as an alternative means to etch the oxide. An etch recipe that uses 25 sccm $CHF_3$, 50 sccm $CF_4$, 100 sccm Ar with 250 W RF power and magnetic field of 60 Gauss at 23 mT pressure in the p5000 etch tool is found to yield very straight sidewalls. The selectivity of this recipe to photoresist is very low and the remaining mask oxide thickness after this step is much less than 3 μm. Polysilicon may be used for hard masking because metals are incompatible with most equipment in the clean room and polysilicon can be automatically removed in the first deep Si RIE step.

In one embodiment, 1 μm of polysilicon is deposited at 610° C. Photoresist is difficult to spin on these wafers because of the rough surface. With a ramped resist spin and 0.5 μm lithography, the resist is hard baked at 110° C. for 30 minutes. The polysilicon is first etched away with the resist mask. An end point detection algorithm with an additional over-etch is used to etch the polysilicon. An over-etch that is larger than required causes faceting in the poly layer. Sidewalls are less faceted than the $CHF_3$ oxide etch at this stage, but the floor is extremely granular, causing jagged edges on the comb fingers. The polysilicon etch with photoresist mask can either be done in a Bosch etcher or in a p5000 tool which uses $Cl_2$ and HBr. Lower temperature polysilicon deposition yields a much smoother floor and consequently smoother sidewalls on the thin fingers. In one embodiment, the deposition is performed at 585° C.

The subsequent poly etch is done using 20 sccm $Cl_2$ and 20 sccm HBr with an RF power of 200W and a magnetic field of 40 Gauss at a pressure of 100 mT. When an over-etch of 20 seconds beyond the end point is used, this recipe yields fairly straight sidewalls on poly. There is a small amount of faceting and a short notch at the top. There is very little poly left on the lines due to the approximate 3:1 selectivity of the oxide etch recipe to poly.

Since the integrity of the mask oxide is a critical issue in SCREAM-like process flows, all silicon etch recipes are tailored to the extent possible for high selectivity to oxide. Chlorine chemistry in deep Silicon etching can be used to give very smooth and straight sidewalls. The process, however, is not very selective to oxide, with selectivities on the order of 10:1 only. The Bosch process, however, has a selectivity of about 133:1 to oxide when a deposition etch cycling process is used at 9W RF power with 40 sccm Argon. This is partly because the deposition of the passivating material over the oxide mask causes the mask to be etched only when the passivation has been removed at some point in the etch step of the cycle. When pure SF6 is used in release steps, selectivities are much lower. Higher power and higher Argon flow both contribute to faster physical etching and hence lower selectivity to the mask. The Bosch process is a fast etch process for silicon and is one choice for deep Si RIE.

The deep Si etch is tuned for the finger gaps in the targeted design variant. A recipe is created that reduces sidewall roughness to the extent possible because the roughness should not be on the order of line width if the structural integrity of the comb finger has to preserved and the comb finger should remain a continuous line. Since the Bosch process works by cycling deposition and isotropic etching steps, the solution is to reduce the deposition and etch time by the same factor. That way the scallops created at each step are smaller than normal. The fact that the scallops are nearly isotropic means that smaller scallops translate to lower etch rate in all directions. Lower lateral etching at each step translates to reduced sidewall roughness. Deposition and etch times can be made as low as 1 second each. There is an etch ramp of 2 seconds between the two steps as in the standard process. At this speed, the mass flow controller can barely keep up with switching the deposition and etching gases. The deposition and etch steps overlap while the gas flow rates stabilize and it is possible that the two processes are actually happening simultaneously. The result is a very smooth sidewall on a very high aspect ratio structure.

The RF power used depends on the desired etch depth and gap. 9W power in the standard Bosch recipe will suffice for a 5 μm gap etched down 25 μm. A 2.5 μm gap requires 12 W of RF power to get the same sidewall profile across the same depth. A short notch is evident at the beginning of the etch. This notch is characteristic of the Bosch process with the oxide mask and causes the line width of the silicon beam to be slightly lower than the oxide line width. Using lower power in a smaller gap will cause trenches to narrow down or lines to widen slightly while using a higher power in a large gap may be too aggressive.

The finite etch rate of SF6 for thermal oxide combined with physical etching of the sidewall oxide requires that a certain minimum oxide thickness be used. For example, 100 nm sidewall oxide shows that the passivation can fail when a high power release is used in narrow gaps such as 2.5 μm. 100 nm sidewalls are however sufficient for the first level release of 5 μm gaps. A thermal oxide layer of 150 nm is usually sufficient for any gap that can be Bosch etched reliably.

A floor clear step is done using a standard $CHF_3/O_2$ process step at 10 mT and 450V. Loading is significant in narrow gaps. In one embodiment, at least a 30% over-etch is required to fully clear the oxide floor in 2.5 μm gap devices. A larger over-etch may reduce the mask oxide thickness more than required.

An optional short deep Si etch of around 5 μm or more at this stage followed by an additional sidewall passivation and floor clear step can be used to make a three level partial overlap comb drive. The etch parameters for this step are similar to the previous deep Si etch, thermal oxidation and floor clear steps. If the partial overlap segment is created then the mask oxide is lower by about 200 nm and the spacing between fingers reduces by about 150 nm. If the overlap segment is omitted at this stage, then the process yields a non-overlapping Z comb drive. The first level release step constitutes release of lines of smaller width. It coincides with the creation of the vertical isolation neck in the larger width lines.

While it is possible to oxidize the thin fingers through and create two level structures before release, post release oxidation combines the oxidation of the thin finger and the isolation neck into one step. It also reduces one floor clear step thus saving mask oxide. We hence pursue the variant of the process flow where both the thin comb fingers and the vertical isolation neck are oxidized through after the first level release. However, oxidizing the thin finger through after release means that an overlap segment is not created in the previous step. This is because the overlap segment has to be on a second level to aid in Z actuation. The smaller line widths on the first level have to be partly or fully oxidized through to differentiate them from the second level. If they are partially oxidized, the oxidation is completed when the isolation necks are oxidized through such that there is some silicon left in the overlap segment.

The release process has conflicting requirements on isotropic etching and loading. For a given lateral etch rate, the isotropic release process has an equal vertical etch rate. A less isotropic etch etches more vertically than laterally thus creating a larger vertical gap between levels to achieve a given size of the isolation neck.

A deep Si etch tool is used for the release process. Instead of deposition-etch cycling, there is one long $SF_6$/Ar etch step. Since the plasma in the Bosch etcher is lit with deposition gases rather than SF6, a short pre-deposition of 5 seconds helps transition from the light step to the release step. A low RF power of 0.1 W with the ICP power maintained at the standard 825 W results in a very isotropic etch. Gaps between fingers which have one-dimensional loading and the honeycomb gaps which have two dimensional loading are etched with respectively slower etch rates. The results in the spring being fully released, as is the outer edge of the wide bar connecting the spring to the mirror. The inner lines on this bar are heavily loaded and take much longer to release.

A higher RF power is used at the cost of more anisotropic etching. The RF power is increased from 0.1 W to 35 W. The larger power gives the ions more energy to penetrate small gaps and reduces the loading effect to a large degree. A reduction in process pressure from 23 mT to 13 mT is also found to reduce the loading effect slightly.

A back side etch is used to release the structures. The actual release time at 35 W power depends on the finger gap in the targeted design variant. Devices with 5 µm finger gap require about 2.5 minutes of release time to completely release thin fingers and to create 0.5 µm necks on bonding pads. Devices with 2.5 µm finger gap require a larger release time between 4 and 6 minutes depending on the size of the isolation neck.

While high RF power solves a lot of the problems with the loading effect, it should be noted that the loading effect may still be present though in smaller measure. To make the release of the springs less aggressive, the springs may be surrounded by blocks of silicon. The springs need enough space to twist about the torsional axis for 10°–20° motion on either side. While this limits the smallest gap that can be created around the spring and hence the degree of control on release loading on the spring, the release is much less aggressive compared to leaving the spring completely open.

Thermal oxidation is a very predictable process. Sidewall oxidation during various steps in the process does not usually need to be characterized. The oxide thickness is read off from a chart based on the one-dimensional Deal-Grove model. At this step, however, the oxidation process is two-dimensional. The one-dimensional model will not correctly estimate the time required for oxidation fingers and necks through.

For the purpose of characterization, the one-dimensional model is used for an initial indication of oxidation time. The wafer is cleaved into several pieces and all pieces are oxidized for the time indicated by the one-dimensional Deal Grove model. One pieces is taken out of the furnace, the oxide is stripped with BHF and it is examined in the SEM to see if the thinner structures have disappeared. If there are remnants of these structures, the rest of the pieces are oxidized further in steps of 10 minutes. Each time, one more piece is stripped and examined and the oxidation is stopped when the thinner structures have completely disappeared.

Considering 1 µm movable structure width, the time taken to oxidize 0.5 µm of silicon is found because the oxidation consumes silicon from both sides of the structures. The release time is calibrated so that necks on wider structures are 1 µm or less in size. With a volume increase factor of 2.27, 0.5 µm silicon oxidizes to 0.5 µm×2.27=1.135 µm of oxide. According to the oxidation chart, it takes 2 hours and 48 minutes to grow 1.135 µm of wet thermal oxide at 1100° C.

In one embodiment, an oxidation time of 3 hours consumes all the silicon in the upper level of the movable structures. Wider structures have a silicon core while thinner structures are etched away.

For the single mask front side device, all suspended structures including the spring, mirror, actuator arms and moving comb fingers are of the same width. All these structures are hence released during the first level release step. The entire moving structure is attached only at the ends of the spring and is hence compliant both in-plane and out-of-plane. Long thermal oxidation of such a compliant structure creates stress-induced deformation. Oxidation induced stresses are offset to some extent by the fact that oxide flows at the oxidation temperature of 1100° C. However, the volume expansion due to oxidation coupled with the differential thermal coefficients of silicon and silicon dioxide create stress in the device. The constraints on the ends of the spring serve as the support points when the device buckles under compressive stress. Buckling may be minimized by making the innermost short movable finger equal to the width of the fixed finger rather than the other movable fingers.

Bracket designs for spring ends may be used. Various designs include a U-shaped bracket and a "butterfly" bracket. There is more room for deformation on the bracket if there are any residual stresses after the device is eventually released and the mask oxide is etched back.

The vertical isolation segment is oxidized through in the same step if the size of the neck is 1 µm or less. The first level release step is timed to achieve such a neck size. The thermal oxidation step is followed by a long oxide floor clear step to make way for the shadow extension etch to create lower level structures.

The long thermal oxidation step grows 1.175 µm of oxide on the floor corresponding to 3 hours of wet oxidation at 1100° C. All lines are now wider and gaps are smaller because of the lateral oxide growth during the oxidation step. The floor is not much deeper, however. This floor clear step requires a larger over-etch due to the narrow gaps. The smallest gap occurs at the innermost comb fingers. This is the critical gap to watch for floor clear and subsequent lower level Si RIE. It is found that a floor clear time of 1 hour and 33 minutes is sufficient for clearing the floor in devices with 5 µm pre-oxidation finger gap. The oxide etch tool etches at a rate of about 1 µm per hour. At this rate, the working value of over-etch is about 33%.

The etch recipe for lower level deep RIE is more aggressive than the first level deep RIE due to the reduced gaps and deeper floors. The first level Bosch recipe is modified for high power to penetrate the smaller and deeper gaps. It is also made more aggressive by increasing the etch step in the deposition-etch cycle from 1 second to 2 seconds. The modified etch step has 15 W RF Power and 2 seconds etch time. Gas flow rates, pressure and other parameters are the same as those in the first deep RIE step. The 15 W, 2 second etch recipe gives excellent results.

The second level deep Si RIE results are used on single mask front side devices because it is easy to remove the entire movable upper level to look at the lower level in the SEM. The front side/back side devices may also use the same process parameters.

The standard Bosch etch process used to etch a straight trench in a wafer will start making a tapering profile if it is not morphed. As the etch progresses, RF power has to be increased and the time in the etch step also has to be increased. The same idea is applied in this case, where the lower level etch parameters have higher power and etch step time compared to the first level etch parameters. The parameters are not continuously morphed, however. The reduction in gap due to oxidation utilizes a discrete change in recipe parameters from the first to the lower level.

With this step, front side processing is complete. A release step following a further sidewall passivation and floor clear is timed to release the lower level comb fingers and not the support structures. Even the wider comb fingers are released because they only have one-dimensional loading. Support structures, the mirror and bonding pads will be attached to the substrate and released with a back side etch that releases everything but the bonding pads. An optional short thermal oxidation step protects the bottom portion of all released structures during back side etch.

A stencil wafer for back side masking is created by exposing the stencil mask on a wafer with mask oxide. The fiducials on the mask are very carefully aligned to the stepper and the wafer itself is aligned to the screws on the stepper chuck. It is important that the device wafer and the stencil wafer are aligned to the stepper in the same fashion so that aligning these two wafers together will eventually align the front side devices to the back side etch vias.

Figure 14:
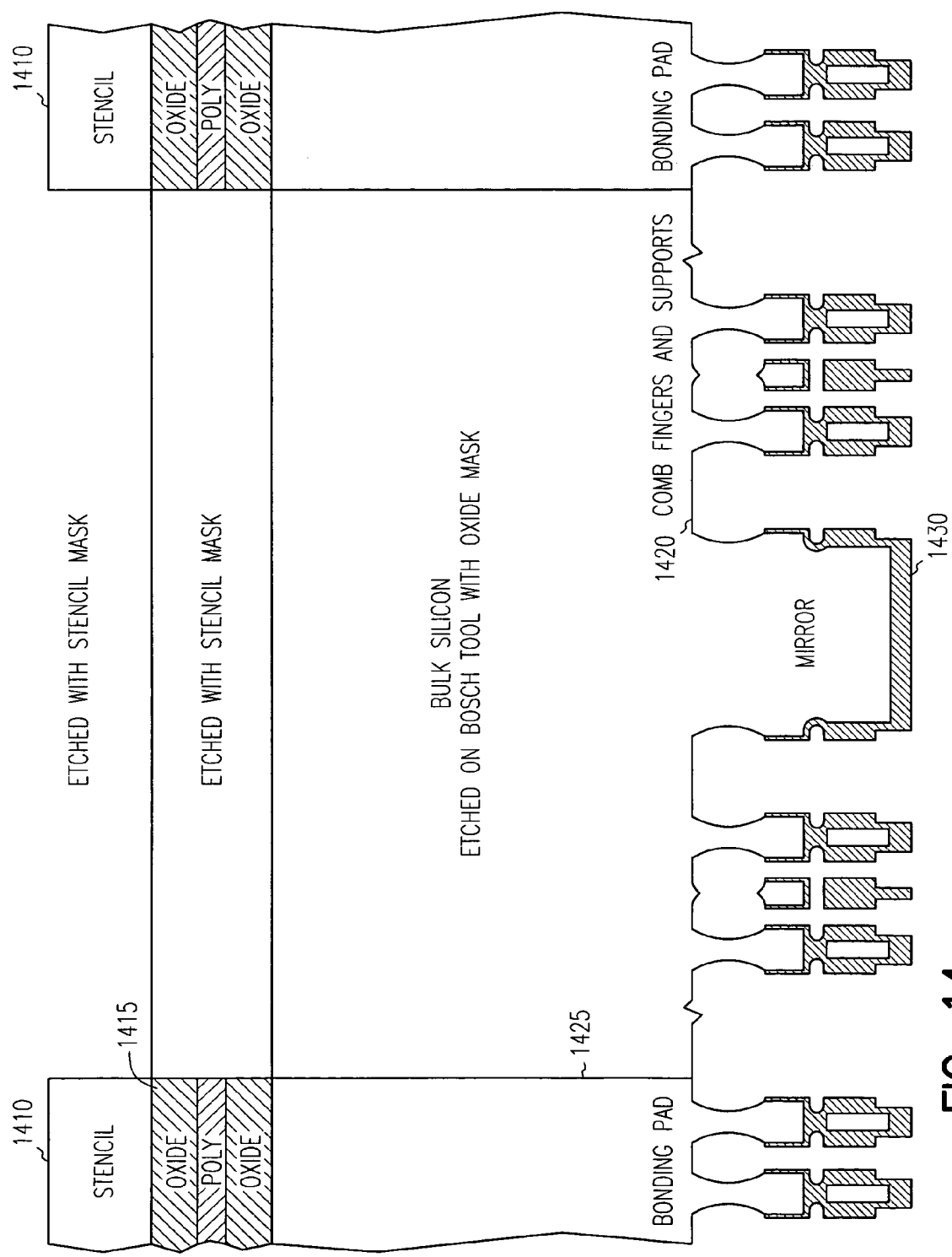
FIG. 14 is a block diagram of a back side stencil etch.

FIG. 14 shows a stencil etch schematic. A stencil mask 1410 has a set of large rectangles corresponding to the back side etch vias. The stencil wafer is etched through in the Bosch tool with a thick oxide mask that lasts until most of the wafer is etched. Any vertical etch recipe can be used with a sufficiently long over-etch. A backing wafer is used below the stencil wafer in the Bosch tool so that when the holes in the stencil wafer break through, there is no Helium leak from the back side. The backing wafer need not be bonded. It simply has to be placed beneath the stencil wafer in the load lock. The entire etch takes between 3 and 5 hours depending on the amount of mask oxide used. If thin mask oxide is used, the mask is depleted faster and the etch rate drops once the amount of exposed silicon increases. The stencil wafer is thin if the mask oxide is thin.

The stencil pattern is transferred to the back side of the device wafer by aligning the flats manually and taping the wafers together. The back side oxide and poly layers 1415 are etched on the device wafer using the taped stencil mask. The initial 3 µm mask oxide and the initial 1 µm polysilicon layer go through all the oxidation steps during front side process flow. As a result, part of the poly layer is oxidized and there is an oxide/poly/oxide layer on the back side.

The stencil is then removed and the device wafer is place upside down into the Bosch tool for back side etching. Breakthrough from the back side is detected by a helium leak alarm.

On the front side, open areas are etched the deepest. This means that when approaching from the back side, the open areas will show first because the deepest portions have the shortest back side depth. The fixed comb finger supports 1420 and the bonding pads 1425 are the most open and these are seen first. Next, the areas around the spring, supports and mirror 1430 are seen. While they are still somewhat enclosed, they are more open than the comb finger gaps and honeycomb gaps.

It can be seen that there is always a horizontal and vertical misalignment between the back side vias and the front side devices. That is the reason why breakthrough happens on one side of the device before the other side. The Bosch process inside the back side etch window is never uniform across the window. The center of the window is etched at a slightly faster rate than the edges. If an alignment error causes a certain feature to be closer to the center, the etch non-uniformity causes this feature to be opened up first before a symmetrical copy of that feature opens up on the other side of the device.

In one embodiment, the back side etch is stopped just before the lower level silicon in the mirror is depleted. This ensures that there is enough silicon in the support structures and the mirror to provide the ground path. The device has to then be released by a long extension etch from the front side. The front side Bosch deep RIE recipe is made even more aggressive by increasing the time in the etch step from 2 seconds to 3 seconds. 15 W RF power is used and deposition time is left at 1 second.

The cumulative effect of high power $SF_6$ etch steps from all the front side process steps depletes mask oxide in the larger structures such as the mirror and later may deplete the oxide on the fixed comb fingers and support structures as well. The top level of the mirror and comb fingers is depleted before the back side fully opens up. It is difficult to make the initial mask oxide any thicker because of the low selectivities involved during the resist/poly/oxide pattern transfer. In a further embodiment, a larger number of poly and oxide layers are used o counter this problem.

The next process variant involved back etching the device after releasing and protecting the actuators from the front side. Only the comb fingers and open floors can be protected this way. The support structures are not released because the honeycomb bonding pads will release simultaneously. The mirror is a large block and cannot be released either. Additionally, a reentrant back side etch with a high RF power of 35 W was used to make the etch windows slightly wider and also to reduce the loading effect in the hope of making the back side floor flatter than before. The wider etch windows are wide enough to overlap neighboring windows. The raised silicon at the interface between etch windows ensures that the spring supports remain attached to the substrate after release. Springs and comb fingers are protected while the mirror and support structures are exposed on the back side.

The wider etch windows increases the uniformity slightly and the lower level comb fingers and spring are well protected. With a combination of front side extension and back side etching, given that there is very little silicon on the upper and lower levels, there is no deformation or warping of the structure, stress related or otherwise, the process with thicker mask oxide.

In one embodiment, the back side etch stops at the point where the lower level of the mirror is exposed. The lower level device is then released with an aggressive front side extension etch. Misaligned etch windows will mean that certain portions of the device are deeper than others. Taller springs will increase the amount of voltage required to actuate the device to a given torsion angle. The device may also have a lower resonance frequency given the larger mass.

In a further embodiment, once the mirror is exposed from the back side, a KOH etch is used to release the device without removing all the silicon from the mirror and support structures. Since KOH stops at the <111> crystal planes, the mirror and support structures might potentially have faceted sidewalls while their center portions are etched away. This would ensure an electrical path along the sidewalls along with lower mass.

As an alternative to wet KOH etching, profile control is used on the Bosch tool to get a tapering profile. A tapering profile is created using large deposition time and low RF power.

SOI wafers with a buried oxide layer at 50 μm will allow a large over-etch from the back side. This method is probably the most tolerant to back side non-uniformities. An additional thin buried oxide layer at 25 μm achieves vertical isolation with small vertical gap between levels so that the non-overlapping Z comb drive is almost as good as the partial overlap comb drive.

Thin wafers can be used for the entire process. Or, the wafer can be thinned down from the back side before patterning the stencil. In the latter case, the front side processing can be done on stronger wafers and thin wafers need to be handled only in the final back side etch stage. Care must be taken with very thin wafers because they may be extremely fragile. The thinning step is done on the entire back side of the wafer after stripping off the oxide and poly layers. The non-uniformity is spread out across a large area. Subsequent PECVD oxide, stencil patterning and deep Si etching limits the non-uniformity to a shorter etch depth.

An additional advantage in using thin wafers is that if the wafer is made very thin and if the PECVD oxide deposited on the back side after thinning is also very thin, then it might be possible to use an Infra Red microscope to see through the oxide and the silicon simultaneously for back side alignment purposes.

CONCLUSION

A new process produces mechanical structures of multiple levels on a single crystal silicon substrate. The process provides high aspect ratio bulk micromachining of single crystal silicon. Structures are fabricated at multiple levels with a single lithography step and without alignment requirements. Differences in height between levels are defined precisely at intermediate etch steps. Growth of oxide is finely controlled to create precise dimensions. One application of this process utilizes out of plane asymmetries produced by the multiple levels to create a large displacement, large force and high linear out of plane actuator stage. The process is combinable with single level high aspect ratio microelectromechanical processing methods.

Several other applications are possible. The above described comb drive uses this process, followed by shadow masking. Optical switches are also formed to move mirrors in and out of the plane of the chip to provide switching of optical based communications and display devices. Actuators for optical displays are also formed using the present process. Actuators having three degree of freedom motion using three nested stages of comb drives are also formed using the present process. Such actuators may be formed with Si tips for mechanical, acoustic or electrical probing. Electrical probes so formed are maneuverable to measure electrical signals one transistor at a time.

Atomic force microscopes are equipped with similar probes or tips that move close to surface. Three degree of freedom miniature actuators are used to position such tips in the x-y plane, and then move the tips in the z direction to get close to a target. In yet a further embodiment, hollow tips are formed on such actuators. These tips may be used for microfluidic applications, such as ink-jet printer heads, injecting samples in cells, or taking samples from cells. Numerous other applications are also envisioned.

The invention claimed is:

1. A method of forming two level structures in a semiconductor substrate, the method comprising:
    forming lines of different widths having a first floor;
    oxidizing the lines until lines of thinner width are substantially fully oxidized and wider lines are not fully oxidized;
    etching the oxide to expose the first floor; and
    etching the exposed first floor deeper into the substrate to form a second floor.

2. The method of claim 1 and further comprising removing the oxide from the lines.

3. The method of claim 2 and further comprising releasing the lines to form a released two level structure.

4. The method of claim 1 wherein the oxide is etched using anisotropic etching.

5. The method of claim 1 wherein etching the oxide comprises using a $CHF_3$ anisotropic reactive ion etch.

6. The method of claim 1 wherein the semiconductor substrate is single crystal silicon.

7. The method of claim 1 wherein the first floor is etched deeper using deep reactive ion etching.

8. The method of claim 1 wherein the lines are oxidized using thermal oxidation.

9. A method of forming multiple level structures in a semiconductor substrate, the method comprising:
    forming structures in the substrate having different widths;
    oxidizing the structures wafer until structures of a desired width are substantially fully oxidized and wider structures are not fully oxidized;
    etching the oxide to expose a floor of the substrate; and
    etching the floor deeper into the substrate to form a next floor.

10. The method of claim 9 and further comprising removing the oxide and repeating oxidizing, etching and etching to form a further level of the multiple level structure, wherein successively wider line widths are oxidized.

11. The method of claim 10 wherein with each successive oxidation, mechanical structures are formed on a new level.

12. The method of claim 11 wherein the successive oxidations are performed to consume lower levels previous formed and create one new level.

13. The method of claim 9 wherein the oxide is etched using anisotropic reactive ion etching.

14. The method of claim 9 wherein etching the floor of the substrate comprises using a reactive ion etch.

15. The method of claim 14 wherein the reactive ion etch comprises a $CHF_3$ reactive ion etch.

16. The method of claim 9 wherein the semiconductor substrate is single crystal silicon.

17. A method of forming multiple two level structures in a semiconductor substrate, the method comprising:
    lithographically forming a pattern having structures of different widths, the structures extending up from a first floor of the substrate;
    oxidizing the structures on the substrate until lines of structures of a selected width are substantially fully oxidized and wider structure are not fully oxidized;
    $CHF_3$ reactive ion etching the oxide to expose the first floor; and
    selectively etching the first floor deeper into the substrate to form a second floor.

18. A method of forming a comb actuator in a semiconductor substrate, the method comprising:
    forming pillars of alternating thick and thin widths extending from a first floor of the substrate;

oxidizing the pillars until pillars of thin width are substantially fully oxidized and thicker lines are not fully oxidized;

etching the oxide to expose the first floor;

etching the first floor deeper into the substrate to form a second floor; and releasing the comb actuator.

19. The method of claim 18 and further comprising removing the oxide and repeating oxidizing, etching and etching to form a further level of the multiple level structure.

20. The method of claim 18 and further comprising forming contacts to independently couple sources to the respective thin and thick lines.

21. The method of claim 18 wherein the thin and thick lines comprise comb fingers with a gap of between approximately 0.3 and 10 microns.

22. A method of forming two level structures in a semiconductor substrate, the method comprising:

forming lines of different widths having a first floor;

oxidizing the lines until lines of thinner width are substantially fully oxidized and lines of thicker width are not fully oxidized;

etching the oxide to expose the first floor;

etching the exposed first floor deeper into the substrate to form a second floor; and releasing the lines to form suspended structures.

23. The method of claim 22 wherein releasing the lines comprises:

oxidizing the lines; and etching the substrate in all directions.

24. The method of claim 23 wherein etching the substrate in all directions comprises a $SF_6$ reactive ion etch.

25. A method of forming multiple two level structures in a semiconductor substrate, the method comprising:

lithographically forming a pattern having structures of different widths, the structures extanding up from a first floor of the substrate;

oxidizing the structures on the substrate until structures of a selected width are substantially fully oxidized and wider patterns are not substantially fully oxidized;

anisotropically etching the oxide to expose the first floor; and selectively etching the first floor deeper into the substrate to form a second floor.

26. The method of claim 25 and further comprising removing the oxide from the lines to form a two level structure.

27. The method of claim 26 and further comprising releasing the two level structure.

* * * * *